HIGH SPEED TRANSISTOR SWITCHING CIRCUIT

Filed Nov. 15, 1962

INVENTORS P. A. HARDING
G. L. VANDERMOLEN
BY Lucian C. Canepa
ATTORNEY

United States Patent Office 3,215,858

Patented Nov. 2, 1965

3,215,858

HIGH SPEED TRANSISTOR SWITCHING CIRCUIT

Philip A. Harding, Middletown, and Gordon L. Vander Molen, Lincroft, N.J., assignors to Bell Telephone Laboratories, Incorporated, New York, N.Y., a corporation of New York Filed Nov. 15, 1962, Ser. No. 237,929
12 Claims. (Cl. 307—88.5)

This invention relates to the translation of electrical information signals, and more particularly to high speed transistor switching circuits.

For high speed transistor switching applications it is the response of the transistor during rise and fall times that basically determines the maximum repetition rate at which the transistor may be driven. The rise time is the time required for the leading edge of the output signal of the transistor to increase in amplitude from ten to ninety percent of its maximum value. Nonlinear characteristics of the transistor, energy storage effects and the characteristics of the external circuit contribute to this time. One way in which the rise time of a transistor may be decreased is to overdrive it. A transistor is overdriven when its input signal exceeds the linear portion of its dynamic transfer characteristic curve and thereby operates the transistor above saturation.

In the fall or decay time of the output signal the amplitude thereof falls from ninety to ten percent of its maximum value. The fall time of the signal is essentially determined by the same factors which determine its rise time. Fall time may be reduced through the application to the transistor of a reverse current signal at the end of the input signal.

Furthermore, when the input of driving current applied to a switching transistor is cut off, the output current thereof does not immediately fall from its maximum to its minimum value but remains instead almost at its maximum value for a finite period of time before decaying to the minimum value. This finite period is called the storage or saturation delay time and results from injected minority carriers being in the base region of the transistor at the moment when the input signal current is cut off. This storage time may also be reduced by applying a reverse current signal to the transistor in approximate time coincidence with the trailing edge of the input signal, whereby the signal repetition rate at which the transistor may be driven is increased.

An object of the present invention is the improvement of signal translating circuits.

More specifically, an object of this invention is the provision of improved high speed transistor switching circuits.

Another object of the present invention is to increase the speed of operation of a switching transistor by decreasing the rise and fall times thereof.

These and other objects of the present invention are realized in a specific illustrative embodiment thereof which includes a grounded-emitter n-p-n transistor stage driven by a common-emitter n-p-n stage. The circuit also includes a differentiating transformer whose relatively high-turn primary winding is connected in series in the collector path of the driving transistor and whose relatively low-turn secondary winding is connected in series in the base path of the driven transistor. In addition, a feedback network is connected between ground and the emitter electrode of the driving transistor.

Under steady state conditions the circuit functions as a conventional direct-current coupled transistor circuit with the second or driven transistor operating in saturation. However, when the driving transistor is turned on, a spike of current is produced which is large compared with the steady state amplitude and which is substantially coincident with the transistor turn-on current transient. This spike of current flows for a brief interval through the secondary of the differentiating transformer and into the base of the driven transistor, thereby turning it on rapidly. This spike of current decays from its maximum amplitude, which is much greater than the amplitude required for saturation, to the steady state value. This current spike also flows through the feedback network to speed up the rise time or turn-on of the driving transistor. When the driving transistor is de-energized a spike of current that is large compared with steady state amplitude, and substantially coincident with the turn-off transient, flows briefly out of the base of the driven transistor and decays to a substantially zero value. This reverse current spike decreases both the minority carrier storage time and the fall time, and thereby the turn-off time, of the driven transistor. The reverse current spike also flows through the feedback network and speeds up the turn-off time of the driving transistor.

It is a feature of the present invention that a switching circuit include one transistor driving another via a differentiating transformer that is characterized by a primary-to-secondary step-down turns ratio.

It is another feature of this invention that the secondary winding of the differentiating transformer interconnect the emitter electrode of the driving transistor to the base electrode of the driven transistor, and that a feedback network interconnect the emitter electrodes of the two transistors.

A complete understanding of the present invention and of the above and other features and advantages thereof may be gained from a consideration of the following detailed description of an illustrative embodiment thereof presented hereinbelow in connection with the accompanying drawing, in which.

Figure 1:
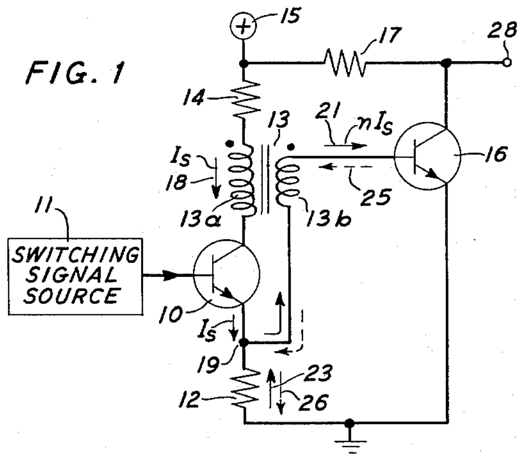
FIG. 1 shows a specific illustrative transistor switching circuit made in accordance with the principles of the present invention.

Referring now to FIG. 1, there is shown a driving transistor 10 to whose base electrode are applied ON-OFF control signals from a switching source 11. The emitter electrode of the driving transistor 10 is connected to a point of reference potential (shown illustratively as ground) through a feedback resistor 12, and the collector electrode of the transistor 10 is connected via the primary winding 13*a* of a differentiating transformer 13 to a bias resistor 14 and a potential source 15. The secondary 13*b* of the transformer 13 includes fewer winding turns than does the primary 13*a* and is directly connected between the emitter electrode of the driving transistor 10 and the base electrode of a driven n-p-n transistor 16. The collector electrode of the transistor 16 is connected via a bias resistor 17 to the aforementioned source 15. In addition, the emitter electrode of the transistor 16 is directly connected to ground.

The dots adjacent to the upper ends of the windings 13*a* and 13*b* of the transformer 13 are intended to indicate that whenever the upper end of the winding 13*a* assumes a particular polarity with respect to the lower end thereof, the upper end of the winding 13*b* assumes that same polarity relative to the lower end thereof. In other words, the transformer 13 is represented as being of the noninverting type.

It is noted that differentiating transformers are well known in the art. See, for example, in this connection FIG. 2·2(*b*) on page 18 of "Waveforms," edited by B. Chance et al., M.I.T. Radiation Laboratory Series, volume 19, McGraw-Hill, 1949. In response to the leading edge of a substantially rectangular input current signal waveform, such a transformer provides across its secondary winding an output signal whose duration is brief and amplitude large relative to that of the input signal. Hereinafter this spike will be called a transient overdrive signal for the driven transistor because of its brief duration and its large amplitude compared with the input amplitude required to operate the transistor at saturation. Similarly, in response to the trailing edge of the input signal there also appears across the secondary winding a relatively brief large amplitude output signal. The polarities of these two noted output signals or spikes are opposite to each other, each being approximately proportional in amplitude to the derivative of the input waveform. By employing a differentiating transformer with a current step-up ratio, i.e., one whose primary-to-secondary turns ratio is greater than unity, the amplitudes of the current spikes appearing across the second winding may be made very large.

To follow the mode of operation of the specific illustrative switching circuit shown in FIG. 1, assume that a positive current waveform 30 (FIG. 3) is applied at time $t_1$ by the signal source 11 to the base of the driving transistor 10. In response to such a signal, the transistor 10 is turned on. Accordingly, a current $I_s$ flows from the source 15 through the resistor 14 and through the primary 13*a* of the differentiating transformer 13 in the direction indicated by arrow 18. If the transistor 10 is characterized by a relatively high value of current gain $\beta$, the current which flows out of the emitter electrode of the transistor 10 approximates the current $I_s$. Herein, in the interest of facilitating the discussion of the FIG. 1 circuit, it will be assumed that these two currents are approximately the same. Hence the current which flows from the emitter electrode of the transistor 10 to node point 19 is also designated $I_s$.

Figure 3:
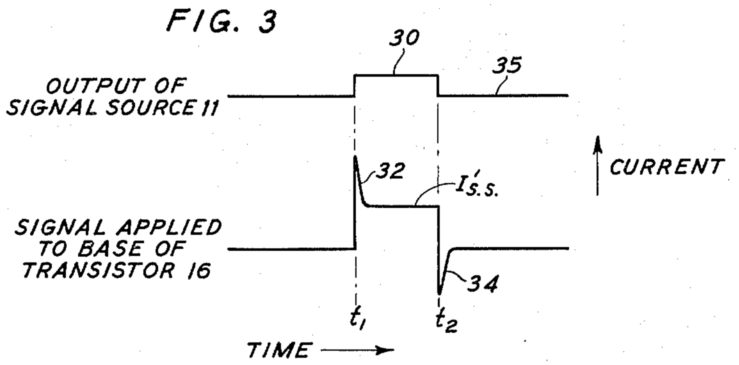
FIG. 3 illustrates two waveforms characteristic of the circuits of FIGS. 1 and 2.

Neglecting for the moment the rise time characteristic of the driving transistor 10, it may be assumed that the current $I_s$ builds up in the primary winding 13*a* substantially instantaneously, causing the upper end of winding 13*a* to become positive with respect to the lower end thereof. As a result, a voltage of the corresponding polarity is induced in the secondary winding 13*b* to cause a transient overdrive current spike to flow in the direction of arrow 21 to drive the transistor 16 into its conducting state. The waveform of the current which flows into the base of the transistor 16 is shown in FIG. 3, the reference numeral 32 designating the noted positive current spike. This transient overdrive of the transistor 16 causes it to turn on rapidly. As indicated in FIG. 3, the spike persists for only a brief interval, so that no appreciable amount of extra power is required to realize this rapid turn-on of the transistor 16. The amplitude of the base current to transistor 16 then falls to its steady state value $I'_{s.s.}$ and operates transistor 16 at saturation.

The magnitude of the positive current spike that flows into the base of the driven transistor 16 during the turn-on time thereof is approximated by the expression $n \cdot I_s$, where $n$:1 is the primary-to-secondary turns ratio of the differentiating transformer 13. This current flows from the base to the emitter of the transistor 16, one portion $I_s$ of this current then flowing from the emitter of the transistor 16 through the source 15 and toward the collector electrode of the driving transistor 10. The remainder $(n-1) \cdot I_s$ of the current $n \cdot I_s$ flows from the emitter of the transistor 16 upward through the feedback resistor 12 in the direction of arrow 23. The resulting voltage developed across the resistor 12 is in the proper direction to enhance the energization of the transistor 10, thereby decreasing the turn-on time thereof.

The positive spike 32 shown in FIG. 3 decreases rapidly in amplitude toward the value $I'_{s.s.}$ which represents the current drive applied to the transistor 16 under steady state conditions. This current $I'_{s.s.}$ is less than the current $I_{s.s.}$ which flows into the collector electrode of the driving transistor 10 under steady state conditions by an amount which is directly related to the relative resistances of the base-to-emitter junction of the transistor 16 and the feedback resistor 12.

Subsequently, at time $t_2$ (FIG. 3) the current supplied to the driving transistor 10 by the switching signal source 11 drops to a de-energization level 35. This causes the magnetic field associated with the primary winding 13*a* of transformer 13 to collapse, whereby a transient current spike of amplitude $n \cdot I_{s.s.}$ (in the direction of dashed arrow 25) is induced in the secondary winding 13*b*. At that time the magnetic field about the secondary winding also collapses, causing a current of value $I'_{s.s.}$ to continue to flow in the direction of the arrow 21. Hence the resulting current spike 34 (FIG. 3) that flows through the secondary winding 13*b* is in the direction of the arrow 25 and has value $n \cdot I_{s.s}-I'_{s.s.}$ This positive current flow away from the base electrode of the driven transistor 16 decreases the minority carrier storage time and the fall time of the transistor 16 and thereby decreases the turn-off time thereof. In addition, the positive current $n \cdot I_{s.s.}-I'_{s.s.}$ flows downward through the feedback resistor 12 in the direction of dashed arrow 26 to develop a voltage thereacross of the proper polarity to reverse bias the base-to-emitter junction of the driving transistor 10, thereby to also hasten the turn-off of the transistor 10 by decreasing its storage and fall times.

Except for the above-described turn-on and turn-off intervals during which the positive and negative current spikes flow, the circuit shown in FIG. 1 behaves in the manner of a conventional direct-current coupled transistor switching circuit. As long as the input signal applied to the base electrode of the driving transistor 10 remains at a positive energization level, the switching circuit depicted in FIG. 1 is in its closed condition. In that condition the transistors 10 and 16 both conduct and a relatively low impedance path exists between output terminal 28 and ground. On the other hand, whenever a de-energization level is applied to the driving transistor 10, both transistors 10 and 16 are nonconducting and a relatively high impedance appears between the output terminal 28 and ground.

As described above, the feedback resistor 12 performs an advantageous function during the turn-on and turn-off times of the switching circuit shown in FIG 1. However, during steady state conditions the resistor 12 may, under some circumstances, be considered undesirable in that it then conducts therethrough a portion of the current output of the driving transistor 10. Because of this, the transistor 10 cannot for a given value of output current drive the transistor 16 as hard as it could if the resistor 12 were removed from the circuit. Ideally, what is desired is a circuit element which exhibits a relatively small impedance during the transient periods and a relatively large impedance during steady state conditions.

Figure 2:
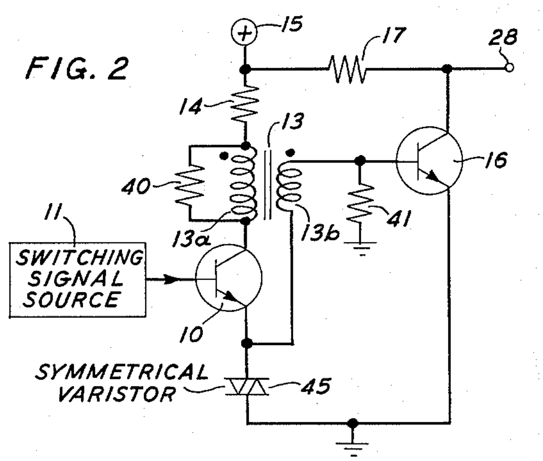
FIG. 2 depicts another specific illustrative embodiment of the present invention.

A circuit which retains the advantages of the FIG. 1 arrangement during the turn-on and turn-off times of the switching cycle, but which functions during the steady state interval to make almost all of the output current of the first transistor available to drive the second transistor, is shown in FIG. 2, which is an alternative embodiment of the principles of the present invention. In FIG. 2, the transistors 10 and 16, the sources 11 and 15, the bias resistors 14 and 17, and the differentiating transformer 13 are identical to the corresponding elements in FIG. 1 and are accordingly designated by the same reference numerals. The main differences between the configurations of FIGS. 1 and 2 are embodied in FIG. 2 in resistors 40 and 41 and symmetrical varistor 45.

Symmetrical varistors are well known in the art. See, for example, pages 21, 72 and 90 of "The Properties, Physics and Design of Semiconductor Devices" by J. N.

Shive, D. Van Nostrand Company, Inc., 1959, wherein such devices are considered in detail. Briefly, a symmetrical varistor is a two-terminal variable resistor which exhibits a nonlinear voltage-current characteristic which is the same for both directions of applied voltage.

The particular varistor 45 shown in FIG. 2 is selected to be one whose resistance is relatively small during the turn-on and turn-off transients but whose resistance is relatively large during steady state condition. As a result, a relatively small amount of the output current of the transistor 10 is drained off via the varistor 45 during steady state conditions, whereby substantially all of that output current is then available to drive the transistor 16.

The resistor 40 is connected in parallel with the primary winding 13*a* of the transformer 13 shown in FIG. 2 to prevent the voltage of the collector electrode of the driving transistor 10 from becoming excessive during the switching cycle of operation of the illustrative circuit. In other words, the resistor 40 is a voltage-limiting element.

The resistor 41 shown in FIG. 2 is included to minimize the possibility that a relatively high voltage from an external circuit (not shown) may, if applied to the collector output terminal 28 of the transistor 16, cause the transistor 16 to break down at a time when it is desired that it be nonconducting or OFF. Such a possibility exists if the base impedance of the driven transistor is relatively high, as it would be during steady state OFF conditions if only the varistor 45 were connected between base and ground of the transistor 16. The addition of the resistor 41 establishes the base impedance of the transistor 16 at a value between that of the varistor alone and that exhibited by the FIG. 1 arrangement. In this way the possibility of the transistor 16 breaking down is largely obviated. At the same time the varistor 45 and the resistor 41 function together to permit relatively large transient spikes to flow into and out of the base electrode of the transistor 16 during turn-on and turn-off, without also diverting to ground during steady state conditions an appreciable amount of the output current of the transistor 10.

It should, of course, be noted that if the FIG. 2 switching circuit is to be used where the possibility of breakdown voltages being applied to the driven transistor 16 is nonexistent, then the resistor 41 may be omitted. In this case the aforenoted advantages of the varistor 45 are fully realized.

One set of elements suitable for inclusion in the switching circuits shown in FIGS. 1 and 2, for the particular case in which the transistor 16 is capable of conducting 425 milliamperes therethrough, is specified below.

Source 15—24 volts, resistor 14—534 ohms, resistor 12—50 ohms, resistor 17—510 ohms, resistor 40—600 ohms, resistor 41—82 ohms, transistor 10—Western Electric type 29A, transistor 16—Western Electric type 20D, varistor 45—two series-connected Western Electric type 100A, and transformer 13—Western Electric type 2594L.

It is to be understood that the above-described arrangements are only illustrative of the application of the principles of the present invention. Numerous other arrangements may be devised by those skilled in the art without departing from the spirit and scope of the present invention. For example, although emphasis herein has been directed to n-p-n transistors, it is apparent that p-n-p units might just as well be used, provided the polarity of the source 15 is changed.

What is claimed is:

1. In combination, first and second transistors, means responsive to the energization of said first transistor for supplying a transient overdrive signal of one polarity to said second transistor to speed up its energization and responsive to the de-energization of said first transistor for supplying a second transient signal of the opposite polarity to said second transistor to speed up its de-energization, and said means including a connection for applying a portion of said transient overdrive signal to said first transistor to speed up its energization and for applying a portion of said second transient signal to said first transistor to speed up its de-energization.

2. In combination in a high speed switching circuit, a driving transistor including two output electrodes, a driven transistor including an input electrode, a differentiating transformer responsive to the energization of said driving transistor for supplying a transient overdrive signal of one polarity to said driven transistor to speed up its energization and responsive to the de-energization of said driving transistor for supplying a transient signal of opposite polarity to said driven transistor to speed up its de-energization, and said differentiating transformer having its primary winding connected to one of said output electrodes and its secondary winding interconnecting the other one of said output electrodes to said input electrode.

3. A combination as in claim 2 wherein said primary-to-secondary winding turns ratio is greater than unity.

4. A combination as in claim 3 wherein said driven transistor includes another input electrode, said combination further including feedback means interconnecting the other one of said output electrodes to said other input electrode.

5. A combination as in claim 4 wherein said feedback means includes a linear resistor.

6. A combination as in claim 4 wherein said feedback means includes a symmetrical varistor.

7. A combination as in claim 6 wherein said driving transistor includes an input electrode, said combination further including a signal source connected to said input electrode of said driving transistor for applying switching signals thereto.

8. A combination as in claim 7 still further including a voltage-limiting resistor connected in parallel with the primary winding of said transformer, and a breakdown-preventing resistor connected between the input electrodes of said driven transistor.

9. In combination in a high speed transistor switching circuit, a common-emitter connected driving transistor which includes a feedback element connected between ground and the emitter electrode thereof, a grounded-emitter driven transistor, and a differentiating transformer which includes a primary winding connected to the collector electrode of said driving transistor and a secondary winding connected between the emitter electrode of said driving transistor and the base electrode of said driven transistor, said differentiating transformer producing a transient overdrive signal input to said driven transistor, the primary-to-secondary turns ratio of said transformer being greater than unity.

10. A combination as in claim 9 wherein said feedback element includes a linear resistor.

11. A combination as in claim 9 wherein said feedback element includes a bidirectional nonlinear resistor whose resistance is relatively low during the transient turn-on and turn-off times of said transistors and whose resistance is relatively high during the steady state portions of the switching cycle of operation of said transistors.

12. In combination in a high speed switching circuit, an emitter-follower amplifier including a transistor having base, emitter, and collector electrodes, a signal source connected to supply pulses to said base electrode for biasing said transistor into conduction for a time interval substantially coincident with the duration of each said pulse and thereby produce turn-on and turn-off transient currents in said collector electrode at the beginning and ending, respectively, of each such time interval, a grounded-emitter amplifier, means coupling the output of said emitter-follower amplifier at said emitter electrode to drive said grounded-emitter amplifier into conduction for the duration of each of said time intervals, said emitter-follower amplifier output having a predetermined steady state amplitude, and a differentiating transformer having a primary winding connected in series with said collector electrode and a secondary winding connected in series in said coupling means, said windings being polarized so that said turn-on and turn-off transient currents in said collector electrode produce in said coupling means transient signals superimposed upon said steady state amplitude for reinforcing said output of said emitter-follower amplifier and driving said grounded-emitter amplifier into conduction for each such time interval.

References Cited by the Examiner

UNITED STATES PATENTS

| | | | |
|---|---|---|---|
| 3,002,110 | 9/61 | Hamilton | 307—88.5 |
| 3,037,130 | 5/62 | Rugaber et al. | 307—88.5 |
| 3,040,185 | 6/62 | Horton | 307—88.5 |

DAVID J. GALVIN, *Primary Examiner.*

UNITED STATES PATENT OFFICE
CERTIFICATE OF CORRECTION

Patent No. 3,215,858 November 2, 1965

Philip A. Harding et al.

It is hereby certified that error appears in the above numbered patent requiring correction and that the said Letters Patent should read as corrected below.

In the grant, lines 1 and 2, and in the heading to the printed specification, lines 4 and 5, for "Gordon L. Vander Molen", each occurrence, read -- Gordon L. Vandermolen --.

Signed and sealed this 7th day of June 1966.

(SEAL)
Attest:

ERNEST W. SWIDER
Attesting Officer

EDWARD J. BRENNER
Commissioner of Patents